(12) United States Patent
Wang et al.

(10) Patent No.: US 10,128,896 B2
(45) Date of Patent: Nov. 13, 2018

(54) FULLY INTEGRATED COMPLETE MULTI-BAND RF FRONTEND SYSTEM INTEGRATED CIRCUIT (IC) CHIP

(71) Applicant: SPEEDLINK TECHNOLOGY INC., Cupertino, CA (US)

(72) Inventors: Hua Wang, Atlanta, GA (US); Thomas Shoutao Chen, Atlanta, GA (US); Dongxu Chen, Huizhou (CN)

(73) Assignee: SPEEDLINK TECHNOLOGY INC., Cupertino, CA (US)

( * ) Notice: Subject to any disclaimer, the term of this patent is extended or adjusted under 35 U.S.C. 154(b) by 0 days.

(21) Appl. No.: 15/989,175

(22) Filed: May 25, 2018

(65) Prior Publication Data

US 2018/0294834 A1 Oct. 11, 2018

Related U.S. Application Data

(63) Continuation of application No. 15/484,037, filed on Apr. 10, 2017, now Pat. No. 10,014,901.

(51) Int. Cl.
*H04B 1/38* (2015.01)
*H04B 1/44* (2006.01)
(Continued)

(52) U.S. Cl.
CPC ............ *H04B 1/44* (2013.01); *H03F 3/195* (2013.01); *H03L 7/24* (2013.01);
(Continued)

(58) Field of Classification Search
CPC .......... H03F 3/24; H03F 1/3241; H03F 3/195; H03F 2200/451; H03F 2200/294; H04B 1/0475; H04B 1/0082; H04B 1/7136; H04B 1/71635; H04B 1/005; H04B 1/406; H04B 1/006; H04B 1/0096; H04B 2001/0491; H04B 1/44; H03L 2207/50; H03L 7/08;
(Continued)

(56) References Cited

U.S. PATENT DOCUMENTS

| | | | |
|---|---|---|---|
| 6,215,988 B1 * | 4/2001 | Matero | H04B 1/005 455/112 |
| 6,385,262 B1 | 5/2002 | Gustafsson | |

(Continued)

*Primary Examiner* — Khanh C Tran
(74) *Attorney, Agent, or Firm* — Womble Bond Dickinson (US) LLP (57) ABSTRACT

According to one embodiment, an RF frontend IC device includes a first RF transceiver to transmit and receive RF signals within a first predetermined frequency band and a second RF transceiver to transmit and receive RF signals within a second predetermined frequency band. The RF frontend IC device further includes a frequency synthesizer coupled to the first and second RF transceivers to perform frequency synthetization in a wide frequency spectrum, including the first and second frequency bands. The frequency synthesizer generates a first LO signal and a second LO signal for the first RF transceiver and the second RF transceiver to enable the first RF transceiver and the second RF transceiver to transmit and receive RF signals within the first frequency band the second frequency band respectively. The first RF transceiver, the second RF transceiver, and the frequency synthesizer are integrated within a single IC chip.

20 Claims, 4 Drawing Sheets

100

(51) Int. Cl.
*H03L 7/24* (2006.01)
*H03F 3/195* (2006.01)
*H04W 72/04* (2009.01)
*H03L 7/093* (2006.01)
*H03L 7/089* (2006.01)

(52) U.S. Cl.
CPC ... *H04W 72/0453* (2013.01); *H03F 2200/294* (2013.01); *H03F 2200/451* (2013.01); *H03L 7/0891* (2013.01); *H03L 7/093* (2013.01)

(58) Field of Classification Search
CPC ......... H03L 7/24; H03L 7/093; H03L 7/0891; H03L 2200/451; H03L 2200/294; H04W 72/0453
See application file for complete search history.

(56) References Cited

U.S. PATENT DOCUMENTS

| | | | |
|---|---|---|---|
| 8,868,126 B2 | 10/2014 | Chen | |
| 2004/0121753 A1* | 6/2004 | Sugar | H04B 1/005 455/333 |
| 2005/0020298 A1 | 1/2005 | Masumoto | |
| 2005/0059372 A1 | 3/2005 | Arayashiki | |
| 2009/0156135 A1 | 6/2009 | Kamizuma | |
| 2013/0028147 A1* | 1/2013 | Black | H04B 1/109 370/277 |
| 2014/0370882 A1* | 12/2014 | Liu | H04W 88/06 455/422.1 |
| 2015/0139122 A1 | 5/2015 | Rimini | |
| 2016/0079934 A1* | 3/2016 | Ichitsubo | H04B 1/0067 330/251 |

* cited by examiner

FULLY INTEGRATED COMPLETE MULTI-BAND RF FRONTEND SYSTEM INTEGRATED CIRCUIT (IC) CHIP

RELATED APPLICATIONS

This application is a continuation application of a co-pending U.S. patent application Ser. No. 15/484,037, filed Apr. 10, 2017, which is incorporated by reference herein in its entirety.

FIELD OF THE INVENTION

Embodiments of the present invention relate generally to a mobile device. More particularly, embodiments of the invention relate to a radio frequency (RF) frontend module of a mobile device.

BACKGROUND

As wireless communications technologies evolve, multi-mode or multi-band wireless systems are routinely available. Such systems may partition different functions into different integrated circuit (IC) devices. For example, a wireless system may include a baseband processor, a transceiver, control circuitry, receive circuitry, transmit circuitry, or the like. Such multiple IC devices are sometimes inconvenient and cost ineffective.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

According to some embodiments, a radio frequency (RF) frontend integrated circuit (IC) chip includes an array of RF transceivers, where each of the RF transceivers transmits and receives RF signals within a particular frequency band (e.g., a particular range of frequencies such as non-overlapped frequency ranges). The RF frontend IC chip further includes a full-band frequency synthesizer coupled to the RF transceivers. The full-based frequency synthesizer generates and provides a local oscillator (LO) signal to each of the RF transceivers to enable the RF transceiver to mix, modulate, and/or demodulate RF signals within a corresponding frequency band. The array of RF transceivers and the full-band frequency synthesizer may be implemented within a single IC chip as a single RF frontend IC chip or package.

According to one embodiment, an RF frontend IC device includes a first RF transceiver to transmit and receive RF signals within a first predetermined frequency band and a second RF transceiver to transmit and receive RF signals within a second predetermined frequency band. The RF frontend IC device further includes a full-band frequency synthesizer coupled to the first and second RF transceivers to perform frequency synthetization in a wide frequency spectrum, including the first and second frequency bands. The full-band frequency synthesizer generates a first LO signal and a second LO signal for the first RF transceiver and the second RF transceiver to enable the first RF transceiver and the second RF transceiver to transmit and receive RF signals within the first frequency band the second frequency band respectively. The first RF transceiver, the second RF transceiver, and the full-band frequency synthesizer are integrated within a single IC chip.

In one embodiment, the full-band frequency synthesizer includes a phase-lock loop (PLL) circuitry or block to generate the first LO signal corresponding to the first frequency band based on a clock reference signal, which may be provided by a local oscillator. The full-band frequency synthesizer further includes an injection locked oscillator coupled to the PLL circuitry to lock onto a first LO frequency of the first LO signal and to derive the second LO signal having a second LO frequency corresponding to the second frequency band based on the first LO signal. The full-band frequency synthesizer may further include a frequency converter to convert the first LO frequency associated with the first LO signal to the second LO frequency associated with the second LO signal. In one embodiment, the frequency converter causes the second LO frequency as approximately twice as the first LO frequency.

In one embodiment, the full-band frequency synthesizer further includes a first in-phase and quadrature (IQ) signal generator to generate a first in-phase LO signal and a first quadrature LO signal based on the first LO signal. The first in-phase LO signal and the first quadrature LO signal are provided to the first RF transceiver to process in-phase components and quadrature components of the RF signals within the first frequency band. The full-band frequency synthesizer further includes a second IQ signal generator to generate a second in-phase LO signal and a second quadrature LO signal based on the second LO signal. The second in-phase LO signal and the second quadrature LO signal are provided to the second RF transceiver to process in-phase components and quadrature components of the RF signals within the second frequency band.

In one embodiment, the first RF transceiver includes a low-band (LB) transmitter to transmit low-band RF (LBRF) signals and a LB receiver to receive LBRF signals within the first frequency band (e.g., approximately ranging 28-39 Giga hertz or GHz), and a first transmitting and receiving (T/R) switch coupled to the LB transmitter and the LB receiver. The first T/R switch is to couple a first RF antenna to the LB transmitter or the LB receiver at a given point in time. In one embodiment, the second RF transceiver includes a high-band (HB) transmitter to transmit high-band RF (HBRF) signals and a HB receiver to receive HBRF signals within the second frequency band (e.g., approximately ranging 58-71 GHz), and a second transmitting and receiving (T/R) switch coupled to the HB transmitter and the HB receiver. The second T/R switch is to couple a second RF antenna to the HB transmitter or the HB receiver at a given point in time.

Figure 1:
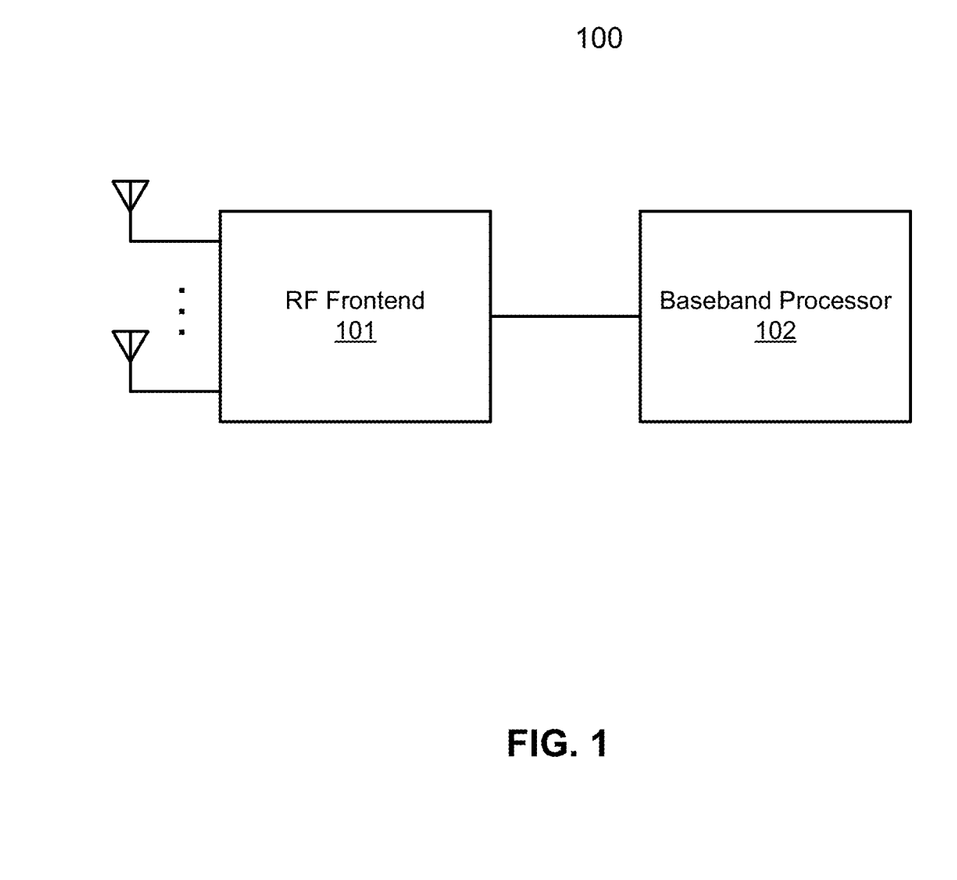
FIG. 1 is a block diagram illustrating an example of a wireless communication device according one embodiment of the invention.

FIG. 1 is a block diagram illustrating an example of a wireless communication device according one embodiment of the invention. Referring to FIG. 1, wireless communication device 100, also simply referred to as a wireless device, includes, amongst others, an RF frontend module 101 and a baseband processor 102. Wireless device 100 can be any kind of wireless communication devices such as, for example, mobile phones, laptops, tablets, network appliance devices (e.g., Internet of thing or IOT appliance devices), etc.

In a radio receiver circuit, the RF frontend is a generic term for all the circuitry between the antenna up to and including the mixer stage. It consists of all the components in the receiver that process the signal at the original incoming radio frequency, before it is converted to a lower intermediate frequency (IF). In microwave and satellite receivers it is often called the low-noise block (LNB) or low-noise downconverter (LND) and is often located at the antenna, so that the signal from the antenna can be transferred to the rest of the receiver at the more easily handled intermediate frequency. A baseband processor is a device (a chip or part of a chip) in a network interface that manages all the radio functions (all functions that require an antenna).

In one embodiment, RF frontend module 101 includes an array of RF transceivers, where each of the RF transceivers transmits and receives RF signals within a particular frequency band (e.g., a particular range of frequencies such as non-overlapped frequency ranges) via one of a number of RF antennas. The RF frontend IC chip further includes a full-band frequency synthesizer coupled to the RF transceivers. The full-based frequency synthesizer generates and provides a local oscillator (LO) signal to each of the RF transceivers to enable the RF transceiver to mix, modulate, and/or demodulate RF signals within a corresponding frequency band. The array of RF transceivers and the full-band frequency synthesizer may be integrated within a single IC chip as a single RF frontend IC chip or package.

Figure 2:
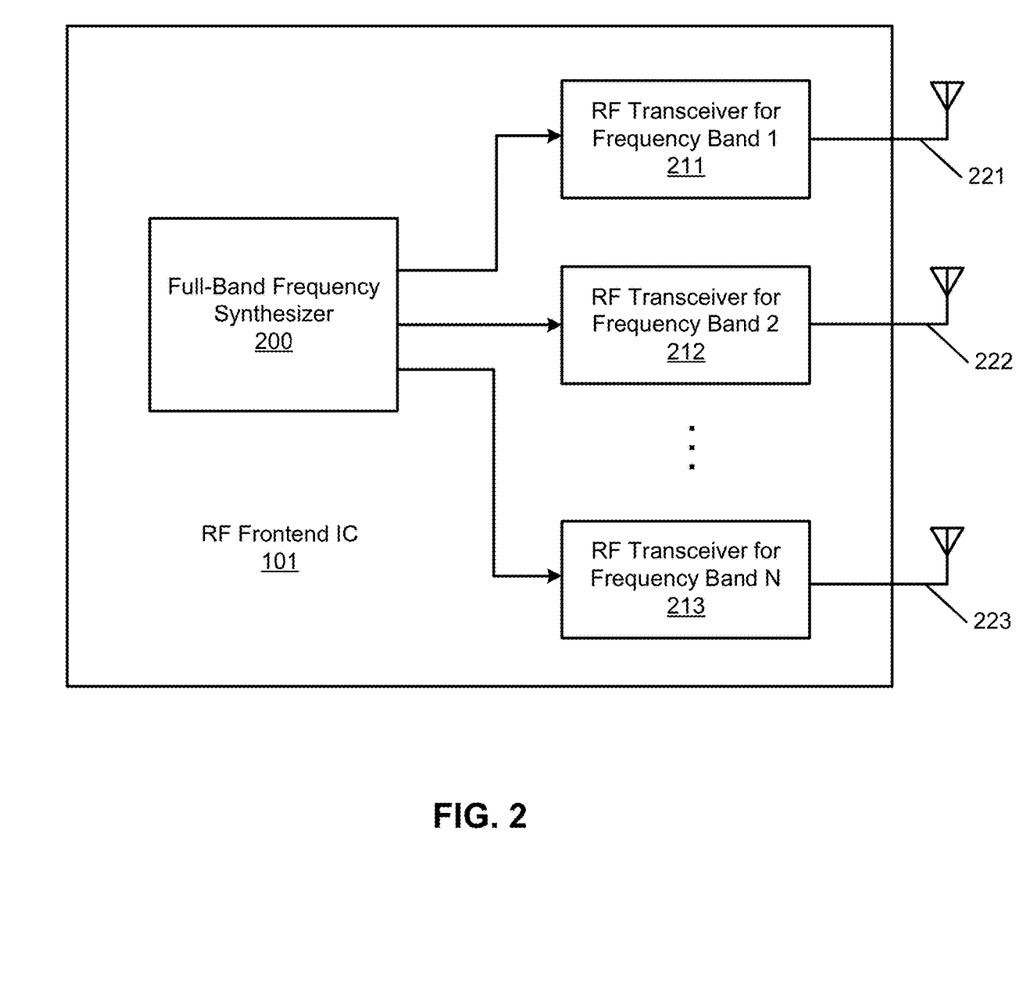
FIG. 2 is a block diagram illustrating an example of an RF frontend integrated circuit according to one embodiment of the invention.

FIG. 2 is a block diagram illustrating an example of an RF frontend integrated circuit according to one embodiment of the invention. Referring to FIG. 2, RF frontend 101 includes, amongst others, a full-base frequency synthesizer 200 coupled to an array of RF transceivers 211-213. Each of transceivers 211-213 is configured to transmit and receive RF signals within a particular frequency band or a particular range of RF frequencies via one of RF antennas 221-223. In one embodiment, each of transceivers 211-213 is configured to receive a LO signal from full-band frequency synthesizer 200. The LO signal is generated for the corresponding frequency band. The LO signal is utilized to mix, modulate, demodulated by the transceiver for the purpose of transmitting and receiving RF signals within the corresponding frequency band.

Figure 3:
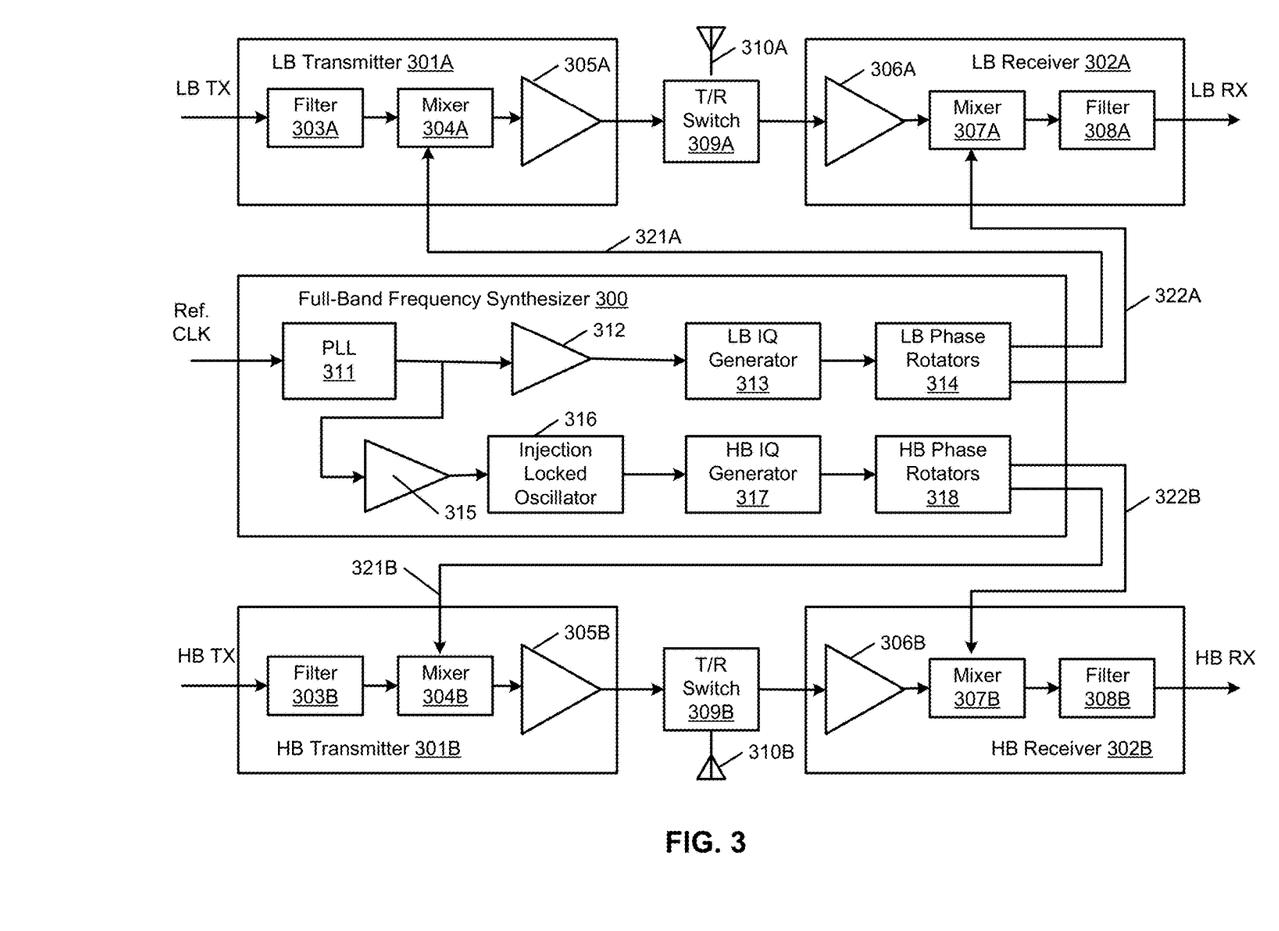
FIG. 3 is a block diagram illustrating an RF frontend integrated circuit according to another embodiment of the invention.

FIG. 3 is a block diagram illustrating an RF frontend integrated circuit according to another embodiment of the invention. Referring to FIG. 3, full-band frequency synthesizer 300 may represent full-band frequency synthesizer 101 as described above. In one embodiment, full-band frequency synthesizer 300 is communicatively coupled to an array of transceivers, each transceiver corresponding to one of a number of frequency bands. In this example, full-band frequency synthesizer 300 is coupled to transmitter 301A, receiver 302A, transmitter 301B, and receiver 302B. Transmitter 301A and receiver 302A may be a part of a first transceiver operating in a lower frequency band, referred to as a low-band (LB) transmitter and LB receiver. Transmitter 301B and receiver 302B may be a part of a second transceiver operating in a higher frequency band, referred to as a high-band (HB) transmitter and HB receiver. Note that although there are only two transceivers as shown in FIG. 3, more transceivers may also be coupled to full-band frequency synthesizer 300 as shown in FIG. 2.

In one embodiment, frequency synthesizer 300 includes, but is not limited to, phase-lock loop (PLL) circuitry or block 311, a LO buffer 312, LB in-phase/quadrature (IQ) generator 313, and LB phase rotators 314. A PLL is a control system that generates an output signal whose phase is related to the phase of an input signal. While there are several differing types, it is easy to initially visualize as an electronic circuit consisting of a variable frequency oscillator and a phase detector. The oscillator generates a periodic signal, and the phase detector compares the phase of that signal with the phase of the input periodic signal, adjusting the oscillator to keep the phases matched. Bringing the output signal back toward the input signal for comparison is called a feedback loop since the output is "fed back" toward the input forming a loop.

Keeping the input and output phase in lock step also implies keeping the input and output frequencies the same. Consequently, in addition to synchronizing signals, a phase-locked loop can track an input frequency, or it can generate a frequency that is a multiple of the input frequency. These properties are used for computer clock synchronization, demodulation, and frequency synthesis. Phase-locked loops are widely employed in radio, telecommunications, computers and other electronic applications. They can be used to demodulate a signal, recover a signal from a noisy communication channel, generate a stable frequency at multiples of an input frequency (frequency synthesis), or distribute precisely timed clock pulses in digital logic circuits such as microprocessors.

Referring back to FIG. 3, PLL block 311 is to receive a clock reference signal and to lock onto the frequency of the clock reference signal to generate a first LO signal, i.e., a low-band LO signal or LBLO signal. The first LO signal may be optionally buffered by a LO buffer 312. Based on the LBLO signal, LB IQ generator 313 generates IQ signals that are suitable for mixing, modulating, and demodulating in-phase and quadrature components of RF signals. The IQ signals may be rotated by a predetermined angle or delayed by LB phase rotators 314. The rotated IQ signals are then provided to LB transmitter 301A and receiver 302A. Particularly, the IQ signals may include transmitting IQ (TXIQ) signals 321A to be provided to LB transmitter 301A and in-phase and quadrature receiving IQ (RXIQ) signals 322A to be provided to LB receiver 302A.

In one embodiment, frequency synthesizer 300 further includes a frequency converter 315, injection locked oscillator 316, HB IQ generator 317, and HB phase rotators 318. Frequency converter 315 is to convert the first LO signal generated from the PLL block 311 to a signal with higher frequency (e.g., within a higher frequency band). In one embodiment, frequency converter 315 includes a frequency doubler to double the frequency of the first LO signal. Injection locked oscillator 316 is to lock onto the doubled-frequency signal received from frequency converter 315 to generator the second LO signal having the second LO frequency approximately twice as the first LO frequency. Note that in this example, the second LO frequency is twice as the first LO frequency. However, frequency converter 315 can convert and generate a frequency in any frequency range. If there are more frequency bands to be integrated within the RF frontend device, more frequency converters may be utilized to convert a reference frequency to a number of other lower or higher frequencies.

Injection locking and injection pulling are the frequency effects that can occur when a harmonic oscillator is disturbed by a second oscillator operating at a nearby frequency. When the coupling is strong enough and the frequencies near enough, the second oscillator can capture the first oscillator, causing it to have essentially identical frequency as the second. This is injection locking. When the second oscillator merely disturbs the first but does not capture it, the effect is called injection pulling. Injection locking and pulling effects are observed in numerous types of physical systems, however the terms are most often associated with electronic oscillators or laser resonators.

Referring back to FIG. 3, HB IQ generator 317 generates IQ signals that are suitable for mixing, modulating, and demodulating in-phase and quadrature components of RF signals in a high band frequency range. In electrical engineering, a sinusoid with angle modulation can be decomposed into, or synthesized from, two amplitude-modulated sinusoids that are offset in phase by one-quarter cycle ($\pi/2$ radians). All three functions have the same frequency. The amplitude modulated sinusoids are known as in-phase and quadrature components. Some people find it more convenient to refer to only the amplitude modulation (baseband) itself by those terms.

The IQ signals may be rotated by a predetermined angle or delayed by HB phase rotators 318. The rotated IQ signals are then provided to HB transmitter 301B and receiver 302B. Particularly, the IQ signals may include transmitting IQ (TXIQ) signals 321B to be provided to HB transmitter 301B and in-phase and quadrature receiving IQ (RXIQ) signals 322B to be provided to HB receiver 302B. Thus, components 312-314 are configured to generate TXIQ and RXIQ signals for LB transmitter 301A and LB receiver 302A, while components 315-318 are configured to generate TXIQ and RXIQ signals for HB transmitter 301B and HB receiver 302B. If there are more transmitters and receivers of more frequency bands involved, more sets of components 312-314 and/or components 315-318 may be maintained by frequency synthesizer 300 for generating the necessary TXIQ and RXIQ signals for the additional frequency bands.

In one embodiment, LB transmitter 301A includes a filter 303A, a mixer 304A, and an amplifier 305A. Filter 303A may be a low-pass (LP) filter that receives LB transmitting (LBTX) signals to be transmitted to a destination, where the LBTX signals may be provided from a baseband processor such as baseband processor 102. Mixer 301A (also referred to as an up-convert mixer or an LB up-convert mixer)) is configured to mix and modulate the LBTX signals onto a carrier frequency signal based on TXIQ signal provided by LB phase rotators 314. The modulated signals (e.g., low-band RF or LBRF signals) are then amplified by amplifier 305A and the amplified signals are then transmitted to a remote receiver via antenna 310A.

In one embodiment, LB receiver 302A includes an amplifier 306A, mixer 307A, and filter 308A. Amplifier 306A is to receive LBRF signals from a remote transmitter via antenna 310A and to amplify the received RF signals. The amplified RF signals are then demodulated by mixer 307A (also referred to as a down-convert mixer or an LB down-convert mixer) based on RXIQ signal received from LB phase rotators 314. The demodulated signals are then processed by filter 308A, which may be a low-pass filter. In one embodiment, LB transmitter 301A and LB receiver 302A share antenna 310A via a transmitting and receiving (T/R) switch 309A. T/R switch 309A is configured to switch between LB transmitter 301A and receiver 302A to couple antenna 310A to either LB transmitter 301A or LB receiver 302A at a particular point in time.

Similarly, HB transmitter 301B includes filter 303B, mixer 304B (also referred to as a HB up-convert mixer), and amplifier 305B having functionalities similar to filter 303A, mixer 304A, and amplifier 305A of LB transmitter 301A, respectively, for processing high-band transmitting (HBTX) signals. HB receiver 302B includes filter 306B, mixer 307B (also referred to as a HB down-convert mixer), and filter 308B having functionalities similar to amplifier 306A, mixer 307A, and filter 308A of LB receiver 302A, respectively, for processing high-band receiving (HBRX) signals. HB transmitter 301B and HB receiver 302B are coupled to antenna 310B via T/R switch 309B similar to the configuration of LB transmitter 301A and receiver 302A.

Figure 4:
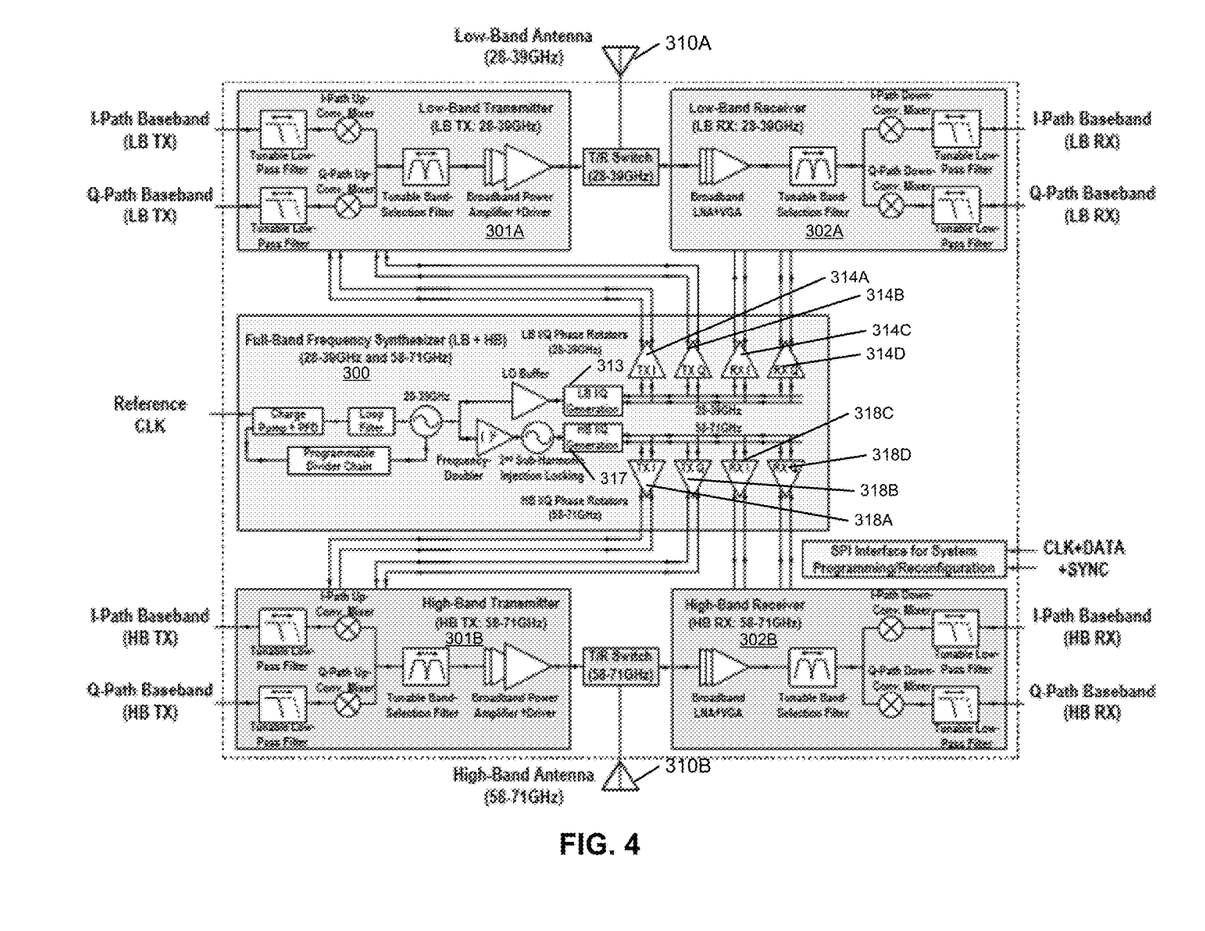
FIG. 4 is a block diagram illustrating an example of an RF frontend integrated circuit according to another embodiment of the invention.

FIG. 4 is a block diagram illustrating an example of an RF frontend integrated circuit according to another embodiment of the invention. Referring to FIG. 4, in this embodiment, each of LB transmitter 301A, LB receiver 302A, HB transmitter 301B, and HB receiver 302B includes two paths: 1) I path for processing in-phase component signals and 2) Q-path for processing quadrature component signals. In one embodiment, LB transmitter 301A includes an I-path low-pass filter (e.g., a tunable low-pass filter) to receive I-path baseband signals and an I-path up-convert mixer to mix and modulate the I-path baseband signals. LB transmitter 301A includes a Q-path low pass filter (e.g., a tunable ow-pass filter) to receive Q-path baseband signals and a Q-path up-convert mixer to mix and modulate the Q-path baseband signals. LB transmitter 301A further includes a tunable band selection filter and an amplifier. The band selection filter (e.g., a band-pass filter) is to select the corresponding frequency band to remove noises that are outside of the corresponding band. The amplifier is to amplify the modulated RF signals to be transmitted to a remote device via antenna 310A. HB transmitter 301B includes similar components as of LB transmitter 301A for processing signals in a higher frequency band.

Similarly, according to one embodiment, LB receiver 302A includes an amplifier (e.g., a low-noise amplifier or LNA) to receive LBRF signals from a remote device via antenna 310A and a band selection filter (e.g., a band-pass filter). LB receiver 302A further includes an I-path down-convert mixer and a Q-path down-convert mixer to mix and demodulate the RF signal into I-path baseband signals and Q-path baseband signals. LB receiver 302A further includes an I-path low-pass filter and a Q-path low-pass filter to processing the I-path baseband signals and the Q-path baseband signals, which can then be provided to the baseband processor. HB receiver 302B includes similar components as of LB receiver 302A for processing signals in a higher frequency band.

In one embodiment, frequency synthesizer 300 includes a PLL block having a charge pump with a phase frequency detector, a loop filter, a programmable divider, a voltage-controlled oscillator. The frequency synthesizer 300 further includes a frequency doubler and an injection locking oscillator as described above with respect to FIG. 3.

In addition, frequency synthesizer 300 includes in-phase transmitting (TXI) phase rotator 314A, quadrature transmitting (TXQ) phase rotator 314B, in-phase receiving (RXI) phase rotator 314C, and quadrature receiving (RXQ) phase rotator 314D, which are specifically configured to perform phase rotation to generate in-phase LO signals and quadrature LO signals for LB transmitter 301A and LB receiver 302A. Specifically, TXI phase rotator 314A is coupled to the I-path up-convert mixer of LB transmitter 301A and TXQ phase rotator 314B is coupled to the Q-path up-convert mixer of LB transmitter 301A to enable the I-path and Q-path baseband signals to be mixed and modulated within the corresponding frequency band. RXI phase rotator 314C is coupled to the I-path down-convert mixer of LB receiver 302A and RXQ phase rotator 314D is coupled to the Q-path down-convert mixer of LB receiver 302A to enable the I-path and Q-path baseband signals to be mixed and demodulated within the corresponding frequency band.

In one embodiment, frequency synthesizer 300 includes in-phase transmitting (TXI) phase rotator 318A, quadrature transmitting (TXQ) phase rotator 318B, in-phase receiving (RXI) phase rotator 318C, and quadrature receiving (RXQ) phase rotator 318D, which are specifically configured to perform phase rotation to generate in-phase LO signals and quadrature LO signals for HB transmitter 301B and HB receiver 302B. Specifically, TXI phase rotator 318A is coupled to the I-path up-convert mixer of HB transmitter 301B and TXQ phase rotator 318B is coupled to the Q-path up-convert mixer of HB transmitter 301B to enable the I-path and Q-path baseband signals to be mixed and modulated within the corresponding frequency band. RXI phase rotator 318C is coupled to the I-path down-convert mixer of HB receiver 302A and RXQ phase rotator 318D is coupled to the Q-path down-convert mixer of HB receiver 302B to enable the I-path and Q-path baseband signals to be mixed and demodulated within the corresponding frequency band.

Again, in this example as shown in FIG. 4, there are two frequency bands covered by the frequency synthesizer 300. However, more frequency bands may be implemented within the integrated RF frontend. If there are more frequency bands to be implemented, more sets of TXI, TXQ, RXI, and RXQ phase rotators may be required.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A radio frequency (RF) frontend integrated circuit (IC) device, comprising:
    a first RF transceiver to transmit and receive RF signals within a first frequency band, the first frequency band having a first range of frequencies;
    a second RF transceiver to transmit and receive RF signals within a second predetermined frequency band having a second range of frequencies, wherein the first range of frequencies is approximately ranging from 28 Giga hertz (GHz) to 39 GHz and the second range of frequencies is approximately ranging from 58 GHz to 71 GHz; and
    a frequency synthesizer coupled to the first RF transceiver and the second RF transceiver to perform frequency synthetization in a frequency spectrum including the first frequency band and the second frequency band, wherein the frequency synthesizer generates a first local oscillator (LO) signal and a second LO signal to the first RF transceiver and the second RF transceiver to enable the first RF transceiver and the second RF transceiver to transmit and receive RF signals within the first frequency band and the second frequency band respectively, and
    wherein the first RF transceiver, the second RF transceiver, and the frequency synthesizer are embedded within a single IC chip.

2. The RF frontend IC device of claim 1, wherein the frequency synthesizer comprises:
    a phase lock loop (PLL) circuitry to generate the first LO signal corresponding to the first frequency band based on a clock reference signal; and
    an injection locked oscillator coupled to the PLL circuitry to lock onto the first LO signal and to derive the second LO signal corresponding to the second frequency band based on the first LO signal.

3. The RF frontend IC device of claim 2, wherein the frequency synthesizer further comprises a frequency converter coupled between the PLL circuitry and the injection locked oscillator, wherein the frequency converter is to convert a first LO frequency associated with the first LO signal to a second LO frequency associated with the second LO signal.

4. The RF frontend IC device of claim 3, wherein the frequency converter is to double the first LO frequency to allow the injection locked oscillator to generate the second LO signal having the second LO frequency that is approximately double of the first LO frequency.

5. The RF frontend IC device of claim 2, wherein the frequency synthesizer further comprises a LO buffering device to buffer the first LO signal prior to providing the first LO signal to the first RF transceiver.

6. The RF frontend IC device of claim 2, wherein the frequency synthesizer further comprises:
    a first in-phase and quadrature (IQ) signal generator to generate a first in-phase LO signal and a first quadrature LO signal based on the first LO signal to be provided to the first RF transceiver; and
    a second IQ signal generator to generate a second in-phase LO signal and a second quadrature LO signal based on the second LO signal to be provided to the second RF transceiver.

7. The RF frontend IC device of claim 6, wherein the first in-phase LO signal and the first quadrature LO signal are provided to the first RF transceiver to enable the first RF transceiver to transmit and receive in-phase components and quadrature components of the RF signals within the first frequency band.

8. The RF frontend IC device of claim 6, wherein the second in-phase LO signal and the second quadrature LO signal are provided to the second RF transceiver to enable the second RF transceiver to transmit and receive in-phase components and quadrature components of the RF signals within the second frequency band.

9. The RF frontend IC device of claim 6, wherein the first RF transceiver comprises:

a low-band (LB) transmitter to transmit low-band RF (LBRF) signals within the first frequency band;
a LB receiver to receive LBRF signals within the first frequency band; and
a first transmitting and receiving (T/R) switch coupled to the LB transmitter and the LB receiver, wherein the first T/R switch is to couple a first RF antenna to the LB transmitter or the LB receiver at a point in time.

10. The RF frontend IC device of claim 9, wherein the LB transmitter comprises:
a first LB up-convert mixer to mix and modulate in-phase components of the LBRF signals to be transmitted; and
a second LB up-convert mixer to mix and modulate quadrature components of the LBRF signals to be transmitted.

11. The RF frontend IC device of claim 10, wherein the frequency synthesizer further comprises:
a first in-phase transmitting (TXI) phase rotator to rotate and transmit the first in-phase LO signal rotated in phase to the first LB up-convert mixer of the LB transmitter; and
a first quadrature transmitting (TXQ) phase rotator to rotate and transmit the first quadrature LO signal rotated in phase to the second LB up-convert mixer of the LB transmitter.

12. The RF frontend IC device of claim 9, wherein the LB receiver comprises:
a first LB down-convert mixer to mix and demodulate in-phase components of the LBRF signals to be received; and
a second LB down-convert mixer to mix and demodulate quadrature components of the LBRF signals to be received within the first frequency band.

13. The RF frontend IC device of claim 12, wherein the frequency synthesizer further comprises:
a first in-phase receiving (RXI) phase rotator to rotate and transmit the first in-phase LO signal rotated in phase to the first LB down-convert mixer of the LB receiver; and
a first quadrature receiving (RXQ) phase rotator to rotate and transmit the first quadrature LO signal rotated in phase to the second LB down-convert mixer of the LB receiver.

14. The RF frontend IC device of claim 6, wherein the second RF transceiver comprises:
a high-band (HB) transmitter to transmit high-band RF(HBRF) signals within the second frequency band;
a HB receiver to receive HBRF signals within the second frequency band; and
a second transmitting and receiving (T/R) switch coupled to the HB transmitter and the HB receiver, wherein the second T/R switch is to couple a second RF antenna to the HB transmitter or the HB receiver at a point in time.

15. The RF frontend IC device of claim 14, wherein the HB transmitter comprises:
a first HB up-convert mixer to mix and modulate in-phase components of the HBRF signals to be transmitted; and
a second HB up-convert mixer to mix and modulate quadrature components of the HBRF signals to be transmitted within the second frequency band.

16. The RF frontend IC device of claim 15, wherein the frequency synthesizer further comprises:

a second in-phase transmitting (TXI) phase rotator to rotate and transmit the second in-phase LO signal rotated in phase to the first HB up-convert mixer of the HB transmitter; and
a second quadrature transmitting (TXQ) phase rotator to rotate and transmit the second quadrature LO signal rotated in phase to the second HB up-convert mixer of the HB transmitter.

17. The RF frontend IC device of claim 14, wherein the HB receiver comprises:
a first HB down-convert mixer to mix and demodulate in-phase components of the HBRF signals to be received; and
a second HB down-convert mixer to mix and demodulate quadrature components of the HBRF signals to be received within the second frequency band.

18. The RF frontend IC device of claim 17, wherein the frequency synthesizer further comprises:
a second in-phase receiving (RXI) phase rotator to rotate and transmit the second in-phase LO signal rotated in phase to the first HB down-convert mixer of the HB receiver; and
a second quadrature receiving (RXQ) phase rotator to rotate and transmit the second quadrature LO signal rotated in phase to the second HB down-convert mixer of the HB receiver.

19. A mobile device, comprising:
a baseband processor; and
a radio frequency (RF) frontend device coupled to the baseband processor, wherein the RF frontend device includes
a first RF transceiver to transmit and receive RF signals within a first frequency band, the first frequency band having a first range of frequencies,
a second RF transceiver to transmit and receive RF signals within a second frequency band, the second frequency band having a second range of frequencies, wherein the first range of frequencies is approximately ranging from 28 Giga hertz (GHz) to 39 GHz and the second range of frequencies is approximately ranging from 58 GHz to 71 GHz, and
a frequency synthesizer coupled to the first RF transceiver and the second RF transceiver to perform frequency synthetization in a frequency spectrum including the first frequency band and the second frequency band, wherein the frequency synthesizer generates a first local oscillator (LO) signal and a second LO signal to the first RF transceiver and the second RF transceiver to enable the first RF transceiver and the second RF transceiver to transmit and receive RF signals within the first frequency band and the second frequency band respectively, and
wherein the first RF transceiver, the second RF transceiver, and the frequency synthesizer are embedded within a single IC chip.

20. The mobile device of claim 19, wherein the frequency synthesizer comprises:
a phase lock loop (PLL) circuitry to generate the first LO signal corresponding to the first frequency band based on a clock reference signal; and
an injection locked oscillator coupled to the PLL circuitry to lock onto the first LO signal and to derive the second LO signal corresponding to the second frequency band based on the first LO signal.

* * * * *